(12) United States Patent
Man (10) Patent No.: US 10,692,695 B2
(45) Date of Patent: Jun. 23, 2020

(54) CROSS SECTION PROCESSING OBSERVATION METHOD AND CHARGED PARTICLE BEAM APPARATUS

(71) Applicant: HITACHI HIGH-TECH SCIENCE CORPORATION, Tokyo (JP)

(72) Inventor: Xin Man, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 16/195,155

(22) Filed: Nov. 19, 2018

(65) Prior Publication Data

US 2019/0164722 A1 May 30, 2019

(30) Foreign Application Priority Data

Nov. 28, 2017 (JP) ................. 2017-228329

(51) Int. Cl.
*H01J 37/30* (2006.01)
*H01J 37/20* (2006.01)
*H01J 37/244* (2006.01)
*H01J 37/22* (2006.01)
(Continued)

(52) U.S. Cl.
CPC .......... *H01J 37/3005* (2013.01); *H01J 37/20* (2013.01); *H01J 37/22* (2013.01); *H01J 37/244* (2013.01); *H01J 37/26* (2013.01); *H01L 22/20* (2013.01); *H01J 2237/20228* (2013.01); *H01J 2237/20285* (2013.01); *H01J 2237/20292* (2013.01); *H01J 2237/221* (2013.01); *H01J 2237/2448* (2013.01); *H01J 2237/24592* (2013.01);
(Continued)

(58) Field of Classification Search
CPC ........ H01J 37/3005; H01J 37/20; H01J 37/22; H01J 37/244; H01J 37/26; H01J 2237/20228; H01J 37/20285; H01J 2237/20292; H01J 2237/2448; H01J 2237/31745; H01J 2237/31749
USPC ............. 250/306, 307, 309, 310, 311, 492.1, 250/492.2, 492.3
See application file for complete search history.

(56) References Cited

U.S. PATENT DOCUMENTS 8,853,629 B2 * 10/2014 Man .................. G01N 23/2202
250/307
9,966,226 B2 * 5/2018 Uemoto ............. G01N 23/2208

FOREIGN PATENT DOCUMENTS

JP 11273613 10/1999
JP 2006155984 6/2006

* cited by examiner

*Primary Examiner* — Nicole M Ippolito
(74) *Attorney, Agent, or Firm* — Holland & Hart LLP (57) ABSTRACT

Provided is a cross-section processing observation method capable of easily and accurately forming a cross-section used to observe a sample's inside, and a cross-section processing observation apparatus for cross-section processing. The method includes a design data acquisition step acquiring design data of a three-dimensional structure of a sample having three-dimensional structure, a moving step moving the sample based on coordinate information of the design data, a surface observation step acquiring an observation image of a surface of the sample, a cross-section forming step irradiating the sample's surface with an ion beam to form a cross-section of the three-dimensional structure, a cross-section observation step acquiring an observation image of the sample's cross-section, and a display step displaying image data, among pieces of the (Continued)

design data, of surface and cross section corresponding to respective locations of the surface and the cross section.

10 Claims, 7 Drawing Sheets

(51) Int. Cl.
*H01J 37/26* (2006.01)
*H01L 21/66* (2006.01)
(52) U.S. Cl.
CPC ................ *H01J 2237/31745* (2013.01); *H01J 2237/31749* (2013.01); *H01L 22/12* (2013.01)

CROSS SECTION PROCESSING OBSERVATION METHOD AND CHARGED PARTICLE BEAM APPARATUS

CROSS REFERENCE TO RELATED APPLICATION(S)

This application claims the benefit of Japanese Patent Application No. 2017-228329, filed Nov. 28, 2017, which is hereby incorporated by reference in its entirety into this application.

BACKGROUND OF THE INVENTION

1. Technical Field

The present invention relates to a cross section processing observation method of processing an observation cross section of a sample when observing the inside of a sample having a three-dimensional structure such as a semiconductor device, and a charged particle beam apparatus for processing a cross section.

2. Description of the Related Art

For example, when observing the inside of a sample having a three-dimensional structure such as a semiconductor device, an arbitrary observation cross section of the three-dimensional structure is obtained by breaking the sample with a focused ion beam (FIB), and this cross section is observed with an electron microscope. For example, when it is necessary to observe defects of a sample, the positions of the defects within an observation cross section of the sample are first identified by using a defect inspection apparatus and cross section processing is then performed based on the obtained position information.

Techniques for determining a processing position on the basis of CAD data of a sample, an observation image of a sample surface, and the like are disclosed (for example, refer to Patent Literature 1). A sample position to undergo processing by a charged particle beam apparatus is determined by associating CAD data of a sample with a secondary charged particle image.

Further, a technique for detecting a processing end point from a cross sectional image by repeating processing and observation of a cross section is disclosed (for example, refer to Patent Literature 2) with regard to FIB-SEM device. With this technique, it is possible to detect an end point for FIB processing by measuring a distance between edges of a specific structure within an SEM observation image which is taken after the FIB processing is performed.

In Patent Literature 1, CAD data or the like and a sample surface are associated in terms of positions. However, it was impossible to associate CAD data with sample positions in a depth direction because an observation target inside the sample cannot be directly seen. Therefore, it is apprehended that an observation target is processed or a sample piece in which an observation target is not included, is cut out.

On the other hand, in Patent Literature 2, when an observation target is smaller than a slicing thickness, it is difficult to observe the observation target with a scanning electron microscope (SEM) in some cases thus the processing end point cannot be precisely detected. In those cases, it is apprehended that the observation target is processed.

DOCUMENTS OF RELATED ART

Patent Literature (Patent Literature 1) Japanese Patent Application Publication No. 2006-155984
(Patent Literature 2) Japanese Patent Application Publication No. H11-273613

SUMMARY OF THE INVENTION

The present invention has been made in view of the above problems, and an object of the present invention is to provide a cross section processing observation method capable of easily and accurately forming an observation cross section of a sample so that the inside of the sample can be observed, and to provide a charged particle beam apparatus for performing cross section processing.

In order to solve the above problem, some aspects of the present invention provide a cross section processing observation method and a charged particle beam apparatus that are described below.

That is, a cross section processing observation method according to the present invention includes: a design data acquisition step of acquiring design data of a three-dimensional structure of a sample having the three-dimensional structure; a moving step of moving the sample on the basis of coordinate information of the design data; a surface observation step of acquiring an observation image of a surface of the sample, a cross section forming step of irradiating the surface of the sample with an ion beam to form a cross section of the three-dimensional structure; a cross section observation step of acquiring an observation image of the cross section of the sample; and a display step of displaying, among pieces of the design data, image data of a surface and a cross section corresponding to locations of the surface and the cross section, respectively.

According to the present invention, by displaying the observation image of the cross section and the cross section image data of the design data in the process of processing the sample while varying a slicing position, it is possible to automatically, easily, and accurately remove a portion of the sample until reaching an observation target cross section of the sample, thereby easily obtaining the sample with the observation target cross section revealed.

The method of the present invention may further include a new cross section forming step of forming a new cross section by removing the sample by a predetermined thickness by performing a slicing process on the cross section of the sample, and an updating step of updating cross section image data corresponding a position of the new cross section, among pieces of the design data.

Preferably, the method of the present invention may further include a positioning step of determining a location of sampling for the sample, on the basis of the design data, and a comparing step of comparing the observation image of the cross section of the sample with the corresponding cross section image data of the design data.

A charged particle beam apparatus according to the present invention includes a charged particle beam column configured to irradiate a sample having a three-dimensional structure with a charged particle beam, a storage unit configured to store design data of the three-dimensional structure, a secondary particle detector configured to detect a secondary particle released from a surface and a cross section of the sample irradiated with the charged particle beam, an image forming unit configured to form, based on a detection signal output from the secondary particle detector, an observation image of the surface of the sample and an observation image of the cross section of the sample, and a display control device configured to display, among pieces of the design date, image data of a surface and a cross section respectively corresponding to locations of the surface and the cross section of the sample among pieces of the design data.

The apparatus of the present invention may further include an updating unit configured to update, among pieces of the design data, image data of a cross section corresponding to a location of a newly exposed cross section resulting from the slicing process, in association with a slicing process of the sample by irradiation with the charged particle beam.

Preferably, the apparatus of the present invention may further include a comparator configured to compare an observation image of the sample with the image data, among pieces of the design data, of a cross section corresponding to the location of the cross section.

According to the present invention, it is possible to provide a cross section processing observation method and a charged particle beam apparatus capable of easily and accurately forming an observation cross section to allow observation of the inside of a sample.

DESCRIPTION OF THE PREFERRED EMBODIMENTS

Hereinafter, preferred embodiments of a cross section processing observation method and a charged particle beam apparatus according to the present invention will be described with reference to the accompanying drawings. It should be noted that the following embodiments are described in detail for better understanding of the gist of the invention and are not intended to limit the present invention unless otherwise specified. In addition, in the drawings used in the following description, noteworthy parts are enlarged for the sake of convenience to help with understanding of the features of the present invention, and the dimensional ratio of each component is not necessarily the same as the actual dimensions.

(Cross Section Processing Apparatus)

Figure 1:
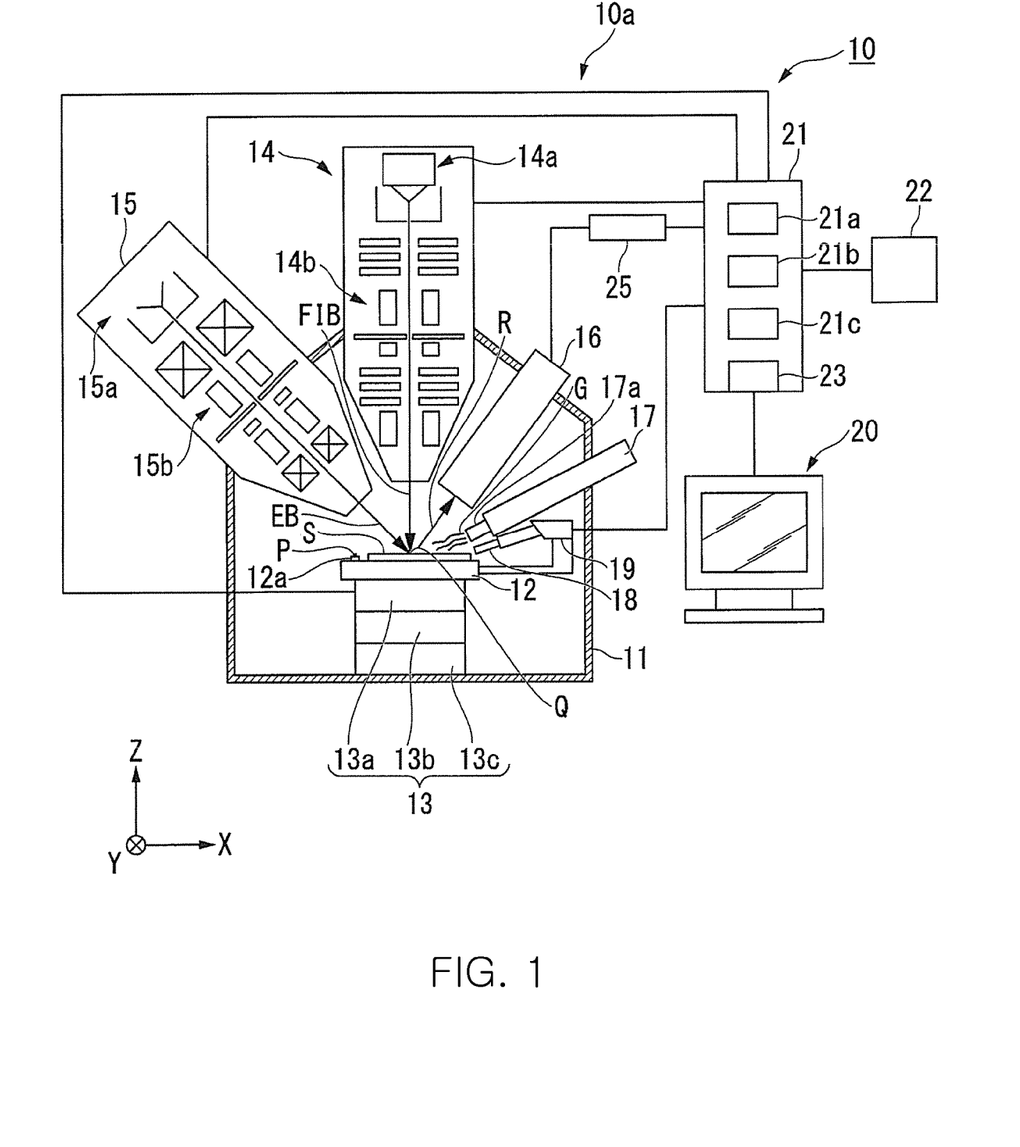
FIG. 1 is a schematic diagram illustrating a schematic configuration of a charged particle beam apparatus according to one embodiment of the present invention.

FIG. 1 is a diagram illustrating a schematic configuration of a cross section processing apparatus equipped with a charged particle beam apparatus according to one embodiment of the present invention.

A cross section processing apparatus 10 according to one embodiment of the present invention includes a charged particle beam apparatus 10a. The charged particle beam apparatus 10a includes a sample chamber 11 having an interior space that can be maintained in a vacuum state, a stage 12 disposed in the sample chamber 11 and configured to retain a sample S in a stationary manner, and a stage driving mechanism 13.

The charged particle beam apparatus 10a includes a focused ion beam optical system (a focused ion beam column) 14 that emits a focused ion beam (FIB) to an irradiation target disposed within a predetermined irradiation region (scanning range) inside the sample chamber 11. In addition, the charged particle beam apparatus 10a includes an electron beam optical system (a charged particle beam column) 15 that emits an electron beam (EB) to an irradiation target disposed within a predetermined irradiation region inside the sample chamber 11.

The charged particle beam apparatus 10a includes a detector (a secondary particle detector) 16 that detects secondary charged particles (i.e., secondary electrons or secondary ions) R released from the irradiation target irradiated with the focused ion beam (FIB) or the electron beam (EB). On the output side of the detector (secondary particle detector) 16, an image forming unit 25 for forming observation images of a surface and a cross section of a sample on the basis of a detection signal output from the detector 16 is provided. The charged particle beam apparatus 10a includes a gas supply unit 17 that supplies a gas G to the surface of the irradiation target. Specifically, the gas supply unit 17 is a gas injection nozzle 17a or the like.

The charged particle beam apparatus 10a includes a needle 18 that extracts a minute sample piece Q (for example, a sample piece for TEM observation) from a sample S retained on the stage 12 and delivers the sample piece Q to a sample piece holder P, and a needle driving mechanism 19 that drives the needle 18 to transport the sample piece Q. The needle 18 and the needle driving mechanism 19 are collectively called a sample piece transfer means.

The charged particle beam apparatus 10a includes a display device 20 on which image data is displayed on the basis of the secondary charged particles R detected by the detector 16, a computer 21, and an input device 22.

The charged particle beam apparatus 10a according to the present embodiment can form an image of an irradiation target, perform various kinds of sputtering-involved processing operations (drilling, trilling, etc.), and form a deposition film by performing beam irradiation in a manner of scanning a focused ion beam over a surface of the irradiation target. With the charged particle beam apparatus 10a, it is possible to perform a process of forming a transmission observation sample piece Q (for example, lamella, needle-shaped samples, etc.) to be observed with a transmission electron microscope (TEM) and/or an analysis sample piece to be observed with an electron beam.

The charged particle beam apparatus 10a can process the sample piece Q in a manner of thinning the sample piece Q delivered to the sample piece holder P to a desired thickness (for example, 5 to 100 nm) suitable for transmission observation using a transmission electron microscope (TEM). With the charged particle beam apparatus 10a, it is possible to observe the surface of an irradiation target by performing beam irradiation in a manner of scanning a focused ion beam or an electron beam over the surface of the irradiation target including the sample piece Q, the needle 18, and the like.

The sample chamber 11 is configured in such a manner that the interior of the sample chamber 11 can be evacuated to a desired vacuum state by using an exhauster (not illustrated) and the desired vacuum state can be maintained.

The stage 12 retains the sample S placed thereon. The stage 12 includes a holder fixing base 12a that retains the sample piece holder P. The holder fixing base 12a is configured in a manner of mounting a plurality of sample piece holders P thereon.

The stage driving mechanism 13 is disposed in the sample chamber 11 and connected to the stage 12. The stage driving mechanism 13 displaces the stage 12 on a predetermined axis according to a control signal output from the computer 21. The stage driving mechanism 13 has a moving mechanism 13a that linearly moves the stage 12 in parallel with at least one of an X axis and an Y axis, which are in parallel with a horizontal plane and are perpendicular to each other, and in parallel with a Z axis that is a vertical direction and is perpendicular to both the X axis and the Y axis. The stage driving mechanism 13 further includes a tilting mechanism 13b that tilts the stage 12 with respect to the X axis or the Y axis and a rotating mechanism 13c that rotates the stage 12 around the Z axis.

The focused ion beam optical system (a focused ion beam column) 14 is fixedly disposed inside the sample chamber 11, with its beam emission surface (not illustrated) disposed vertically above the stage 12 positioned within an irradiation region inside the sample chamber 11 and with its optical axis aligned in parallel with the vertical direction. Therefore, a focused ion beam can be emitted to an irradiation target including the sample S fixedly mounted on the stage 12, the sample piece Q, and the needle 18 that are all positioned within the irradiation region in the vertical direction.

The focused ion beam optical system 14 includes an ion source 14a for generating ions and an ion optical system 14b for focusing and deflecting ions discharged from the ion source 14a. The ion source 14a and the ion optical system 14b are controlled in accordance with a control signal output from the computer 21. Namely, the irradiation target position and the irradiation condition of the focused ion beam are controlled by the computer 21.

The ion source 14a is, for example, a liquid metal ion source made of liquid gallium or the like, a plasma-type ion source, a gas field ionization-type ion source, or the like. The ion optical system 14b includes, for example, a first electrostatic lens (for example, a condenser lens), an electrostatic deflector, a second electrostatic lens (for example, an objective lens), and the like.

The electron beam optical system (a charged particle beam column) 15 is fixedly disposed inside the sample chamber 11, with its beam emission surface (not illustrated) facing the stage 12 positioned within the irradiation region inside the sample chamber 11 in an oblique direction inclined by a predetermined angle (for example, 60°) from the vertical direction, and its optical axis aligned in parallel with the oblique direction. Therefore, an electron beam can be emitted in an obliquely downward direction to the irradiation target including the sample S retained on the stage 12, the sample piece Q, and the needle 18 that are all positioned within the irradiation region.

The electron beam optical system 15 includes an electron source 14a for generating electrons and an electron optical system 15b for focusing and deflecting electrons discharged from the electron source 14a. The electron source 14a and the electron optical system 15b are controlled in accordance with a control signal output from the computer 21. Namely, the irradiation location and the irradiation condition of the electron beam are controlled by the computer 21. The electron optical system 15b includes, for example, an electron lens and a deflector.

Alternatively, the arrangement of the electron beam optical system 15 and the focused ion beam optical system 14 can be changed such that the electron beam optical system 15 is disposed in the vertical direction and the focused ion beam optical system 14 is disposed in the oblique direction inclined by a predetermined angle from the vertical direction.

The detector 16 detects the intensity of secondary charged particles (i.e., the amount of secondary electrons or secondary ions) R released from the irradiation target when the focused ion beam or the electron beam is emitted to the irradiation target including the sample S and the needle 18 and outputs information of the amount of the detected secondary charged particles R. In the sample chamber 11, the detector 16 is disposed at a position where the amount of the secondary charged particles R can be detected. For example, the detector 16 is disposed obliquely above the irradiation target including the sample S within the irradiation region. The detector 11 is installed in a fixed manner.

The gas supply unit 17 is fixed to the sample chamber 11, has a gas injection part (also referred to as a nozzle) disposed inside the sample chamber 11, and is arranged to face the stage 12. The gas supply unit 17 can supply an etching gas to selectively etch the sample S in conjunction with the focused ion beam according to the material of the sample S, or supply a deposition gas to form a deposition film with deposit such as a metal or an insulator on the surface of the sample S. For example, it is possible to selectively promote etching of an Si-based sample S and an organic sample S by supplying an etching gas of xenon fluoride and an etching gas of water to the Si-based sample S and the organic sample S, respectively while irradiating the Si-based sample S and the organic sample S with a focused ion beam. In addition, for example, by supplying a deposition gas containing platinum, carbon, tungsten or the like to the sample S which is irradiated with the focused ion beam, a solid component decomposed from the deposition gas can be deposited on the surface of the sample S. Specific examples of the deposition gas containing carbon include phenanthrene and naphthalene. Examples of the deposition gas containing platinum include trimethyl•ethylcyclopentadienyl•platinum. Examples of the deposition gas containing tungsten include tungsten hexacarbonyl. Depending on the supplied deposition gas, it is also possible to perform etching or deposition in conjunction with irradiation of an electron beam.

The needle driving mechanism 19 is accommodated in the sample chamber 11 in a state of being connected with the needle 18, and displaces the needle 18 according to a control signal transmitted from the computer 21. The needle driving mechanism 19 is integrated with the stage 12. Therefore, for example, when the stage 12 is tilted around a tilt axis (the X axis or the Y axis) by the tilting mechanism 13b, the needle driving mechanism 19 moves along with the stage 12. The needle driving mechanism 19 includes a moving mechanism (not illustrated) that moves the needle 18 in parallel with each of the axes of a three-dimensional coordinate, and a rotating mechanism (not illustrated) that rotates the needle 18 on the central axis of needle 18. This three-dimensional coordinate system of the needle driving mechanism is independent of the orthogonal tree-axis coordinate system of the sample stage. The three-dimensional coordinate system of the needle driving mechanism is also an orthogonal three-axis coordinate system having two-dimensional coordinate axes parallel to the surface of the stage 12. When the surface of the stage 12 is in an inclined state or a rotated state, this coordinate system is inclined or rotated.

The computer 21 is disposed outside the sample chamber 11. The computer 21 includes a display device 20, a display control device 23 that controls the display device 20, a storage unit 21a, a comparator 21b, and an updating unit 21c. Further, an input device 22 such as a mouse and a keyboard for outputting a signal corresponding to an input operation by an operator is connected to the computer 21. The computer 21 integrally controls the operation of the charged particle beam apparatus 10a according to a signal output from the input device 22 or a signal generated through a preset automatic operation control process.

The display control device 23 is composed of an IC chip or the like. The display control device 23 functions to control the display device 20 such that image data corresponding to locations of a surface and a cross section of the sample, among pieces of design data of the three dimensional structure formed inside the sample S, is displayed on the display device 20 during execution of the cross section processing observation method described below.

The storage unit 21a is composed of, for example, a storage memory, a hard disk, and the like, and stores the design data of the three-dimensional structures during the execution of the cross section processing observation method described below.

Further, the comparator 21b is composed of, for example, a CPU, a cache memory, and the like. During the execution of the cross section processing observation method described below, the comparator 21b compares an observation image of a sample with image data corresponding to a location of a processed cross section, among the pieces of the design data of the three-dimensional structure.

The updating unit 21c is composed of, for example, a CPU, a storage memory, or the like. In the cross section processing observation method described below, the updating unit operates in conjunction with a process of slicing the sample by using an electron beam (EB). For example, when the sample S is sliced so that a new cross section is revealed, cross section image data corresponding to a location of the new cross section, among the pieces of the design data of the three-dimensional structure formed inside the sample S, is updated.

The comparison between the observation image of the sample and the image data, and the determination of matching or not-matching thereof are performed by an image analysis software executed in the computer 21.

Further, the computer 21 converts the amount of secondary charged particles R detected by the detector 16 while an irradiation location is irradiated with a charged particle beam to a luminance signal associated with the irradiation location, and generates image data representing the form of an irradiation target on the basis of the two-dimensional position distribution of the amount of the detected secondary charged particles R.

The display device 20 displays a designed cross sectional image of an arbitrary cross section, which is included in design data of a three-dimensional structure, or an actual cross sectional image of the sample S, which is generated based on the amount of the secondary charged particles R released from the irradiation target. The display device 20 also displays a screen for receiving operation inputs for enlarging, reducing, moving, and rotating the cross sectional image. The computer 21 causes the display device 20 to display a screen for helping with various settings such as mode selections and processing conditions for sequence control.

Preferably, the charged particle beam apparatus 10a of the present invention only have to include at least an electron beam optical system (a charged particle beam lens column) 15, a storage unit 21a, a detector (a secondary particle detector) 16, and an image forming unit 25, and a display control device 23.

(Cross Section Processing Observation Method: Preliminary Process (Sampling))

Next, a cross section processing observation method of the present invention which is performed by using the cross section processing apparatus described above will be described.

In the embodiment described below, a sample piece Q including an observation target cross section, which is a cross section to be observed, is extracted through microsampling from a bulk sample S having a three-dimensional structure inside thereof, such as a semiconductor circuit (preliminary process). Next, processing to form the observation target cross section by removing a portion of the sample piece along a processing direction is performed (post process).

Figure 2:
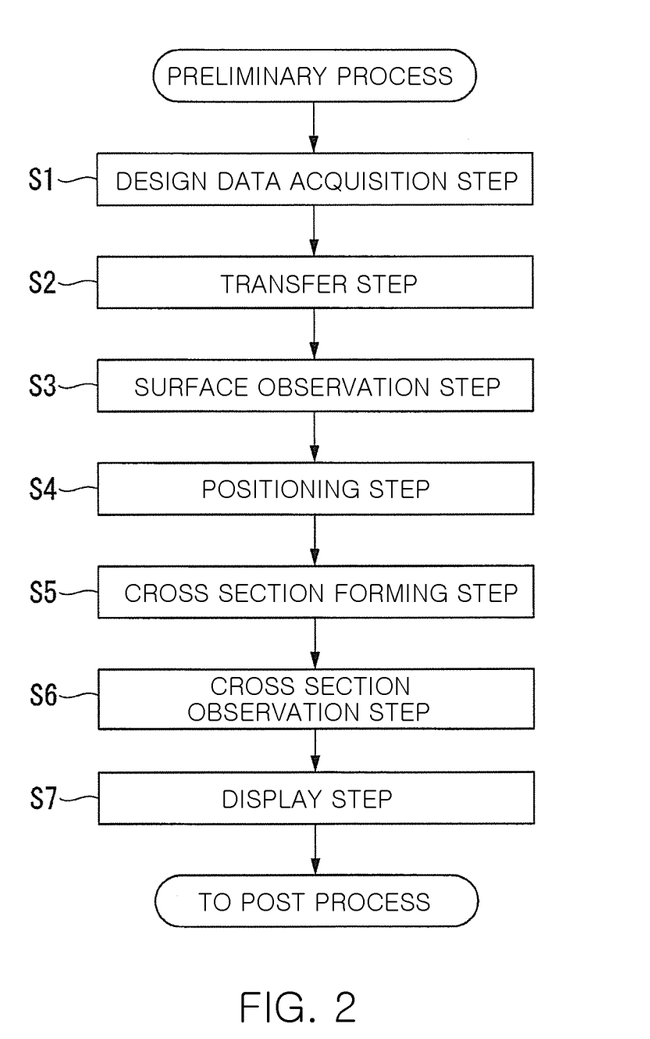
FIG. 2 is a flowchart illustrating, step by step, a preliminary process of a cross section processing observation method of the present invention.

FIG. 2 is a flowchart illustrating, step by step, a preliminary process of the cross section processing observation method of the present invention.

First, an instruction is given to acquire the design data of the three-dimensional structure formed in the sample S via the input device 22 of the computer 21, and the acquired design data of the three-dimensional structure is stored in the storage unit 21a of the computer 21 (S1: design data acquisition step). For example, in the case of a semiconductor circuit, the design data may be circuit design data including coordinate values that represent a three-dimensional structure of the circuit.

Next, for example, among three faces of a rectangular sample S (hereinafter, three faces are referred to as a top face (XY plane), a front face (XZ plane), and a side face (YZ plane)), the stage 12 is moved with respect to at least two faces and preferably three faces (S2: a moving step). The coordinates of the stage 12 at the time of movement may be the design data of the three-dimensional structure formed in the sample S or defect position information of the sample S, which is preliminarily detected by a defect inspection apparatus, and the like. The stage 12 can also be moved based on various position information.

Next, at the position to which the stage 12 is moved, the sample S is irradiated with an electron beam EB by the electron beam optical system 15. Then, the secondary charged particles R released from the sample S are detected by the detector 16, and an SEM image of the sample S is acquired by the computer 21 (S3: surface observation step). The SEM images of the sample S are obtained from at least two of the three faces of the sample S. The SEM images are obtained from, for example, a surface and a cross section of the sample S. Alternatively, the SEM images are obtained preferably with respect to all of the three faces of the sample.

Next, based on the design data of the three-dimensional structure of the sample S, a small region including an observation target cross section is determined (S4: positioning step). Next, coordinates (contour coordinates) of the observation target cross section are selected from, for example, the design data of the three-dimensional structure and then input to the computer 21.

The computer 21 drives the electron beam optical system 15 to emit a focused ion beam FIB to the sample S on the stage 12 according to the inputted coordinate data, thereby forming an observation target cross section of the three-dimensional structure formed in the sample S (S5: cross section forming step).

Next, the electron beam optical system 15 emits an electron beam EB to the observation target cross section of the three-dimensional structure formed through the cross section forming step S5; the detector 16 then detects the secondary charged particles R released from the observation target cross section of the three-dimensional structure; and the computer 21 generates an SEM image of the observation target cross section of the three-dimensional structure (S6: cross section observation step).

Next, on the display device 20, the SEM images of two or three cross sections of the sample S obtained in the cross section observation step S6, and designed images of the design data of the three-dimensional structure of parts each corresponding to structure the SEM images are displayed (S7: display step).

Figure 4A:
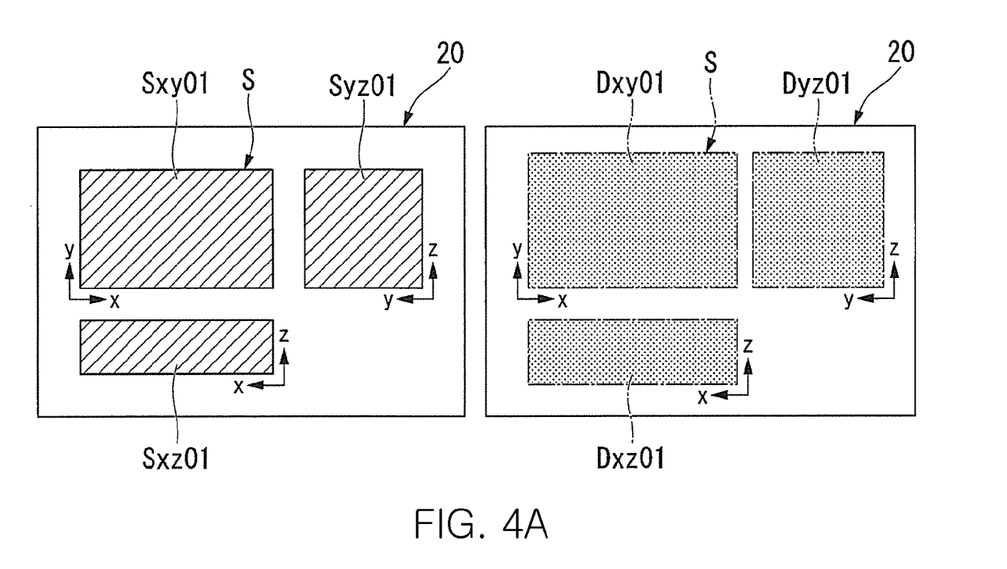
FIG. 4A, FIG. 4B and FIG. 4C are explanatory diagrams illustrating magnification adjustment of a cross sectional image.

For example, in the display step S7, as illustrated in FIG. 4A, a top face SEM image Sxy01, a front face SEM image Sxz01, and a side face SEM image Syz01 of the sample S are displayed on the display device 20. In addition, a top face image Dxy01, a front face image Dxz01, and a side face image Dyz01 corresponding to the design data are also displayed on the display device 20.

Figure 4B:
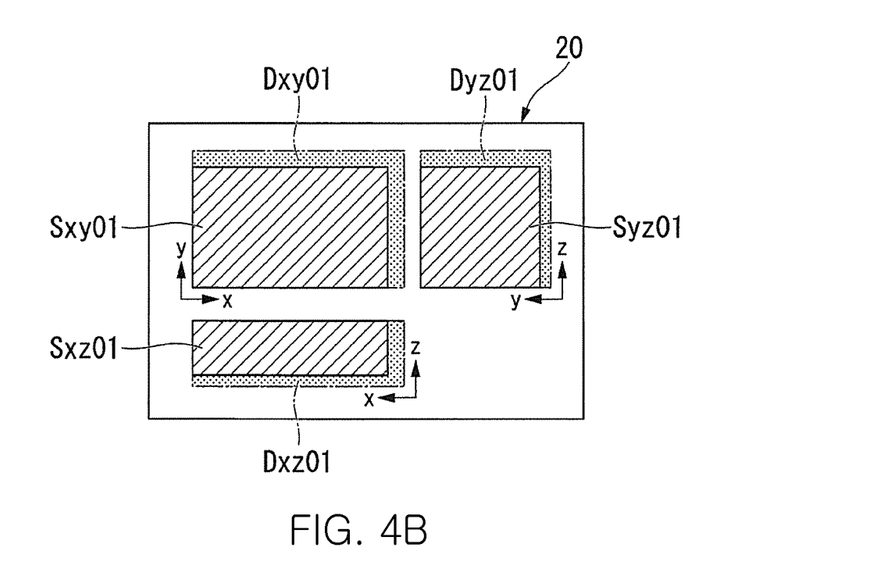
Figure 4C:
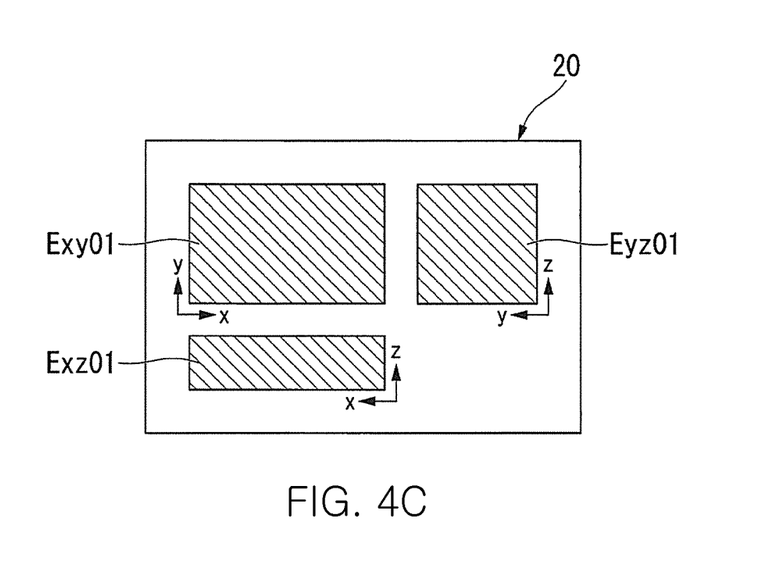

Next, as illustrated in FIG. 4B, the SEM images of the three faces of the sample S are superimposed, respectively, on the corresponding designed images of three faces of the design data. Next, as illustrated in FIG. 4C, the sizes of these two kinds of images are adjusted to be matched (that is, the display magnifications are matched). Next, the resulting magnification-adjusted images including an adjusted top face image Exy01, an adjusted front face image Exz01, and an adjusted side face image Eyz01 are displayed (S5). This magnification adjustment is performed such that the sizes of the designed images of the three faces included in the design data are adjusted to match the sizes of the SEM images of the sample S. Conversely, the sizes of the SEM images of the sample S may be adjusted to match the sizes of the designed images of the design data. Thus, the SEM images (cross sections) of the processed surfaces of the sample piece Q extracted from the sample S in the post process, and the corresponding designed images (cross sections) of the design data are displayed on the same scale on the screen of the display device 20. Therefore, it is possible to determine whether the corresponding images match or does not match.

According to the preliminary process (sampling) of the cross section processing observation method of the present invention, the surface of the sample is first processed by a focused ion beam FIB to reveal an observation target cross section, and then the SEM image of the observation target cross section is generated. Therefore, it is possible to obtain an observation image of the observation target cross section without moving the stage 12, i.e., without causing a positional misalignment.

(Cross Section Processing Observation Method: Post Process (Cross Section Processing))

Figure 3:
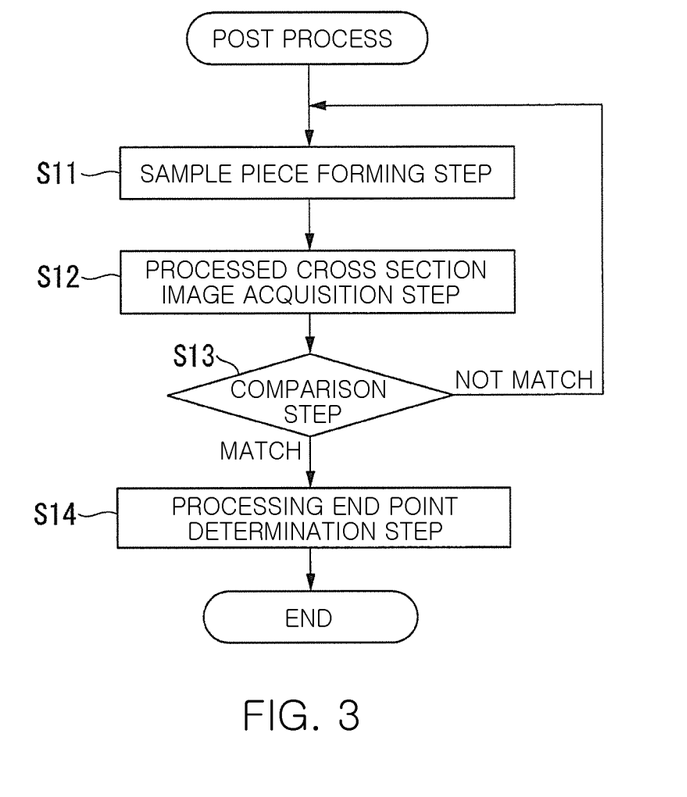
FIG. 3 is a flowchart illustrating, step by step, a post process of a cross section processing observation method of the present invention.

FIG. 3 is a flowchart illustrating, step by step, a post process of the cross section processing observation method of the present invention.

Figure 5:
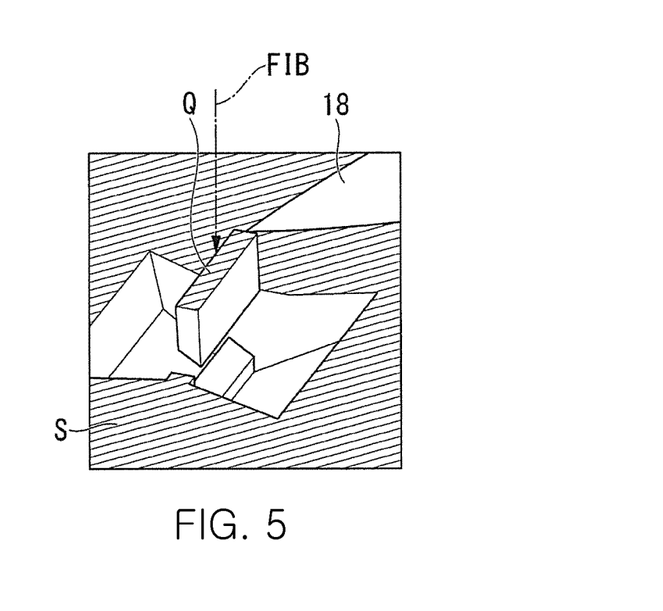
FIG. 5 is a perspective view illustrating an operation of extracting a sample piece from a sample.

The computer 21 drives the electron beam optical system 15 to emit a focused ion beam FIB to the sample S on the stage 12 according to the input coordinate data, thereby forming a sample piece which is a small region of the sample S (S11: sample piece forming step). More specifically, based on the input coordinate data, the computer 21 drives the focused ion beam optical system 14 to emit a focused ion beam FIB toward the sample S. As a result, as illustrated in FIG. 5, in the sample S, the periphery of the observation target cross section is etched so that the sample piece Q including the observation target cross section can be formed. Then, the needling driving mechanism 19 is driven to move the needle 18 so that the needle 18 comes into contact with the sample piece Q, and then the sample piece Q attached to the needle 19 is extracted. Next, the sample piece Q is fixed to the sample piece holder P.

Figure 6:
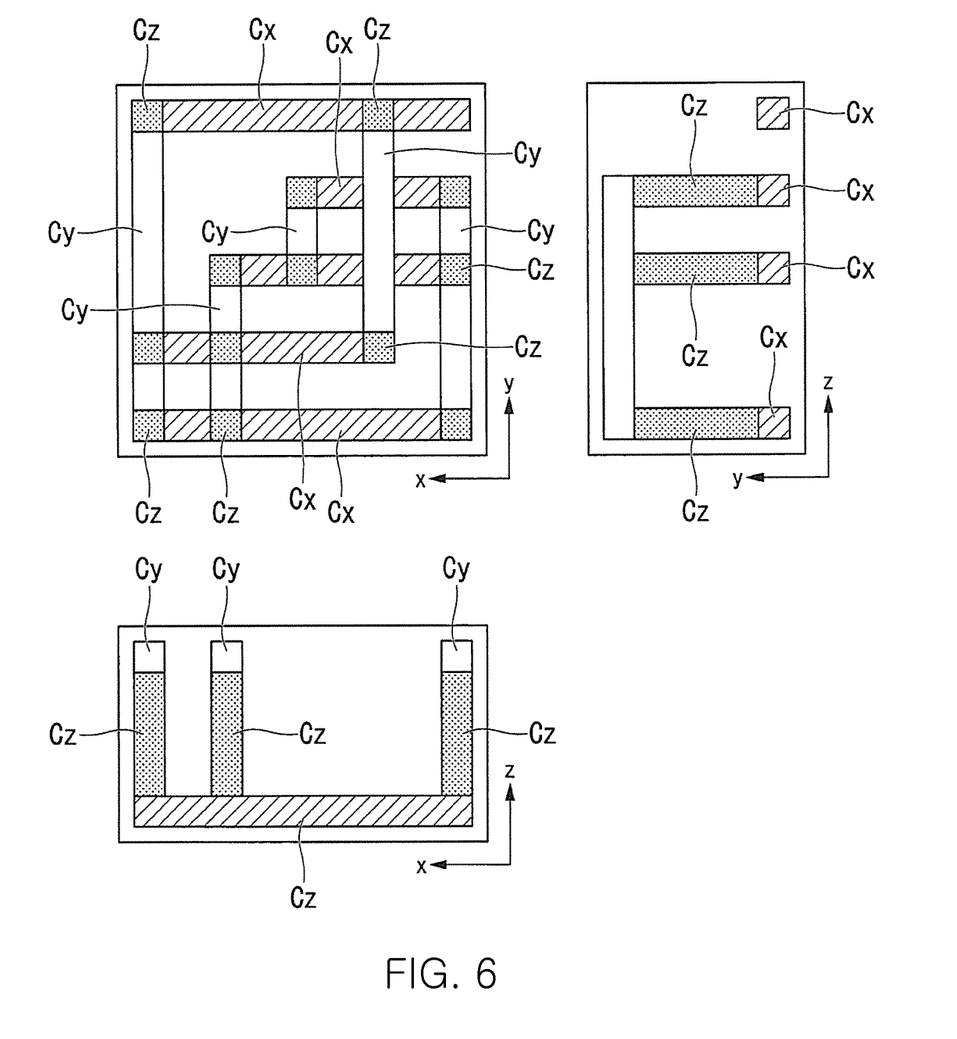
FIG. 6 is a three-view diagram illustrating three faces of an exemplary three-dimensional structure.

Next, the cross section processing is performed on the formed sample piece (sample) Q to expose an observation target cross section. In describing the post process, as an example of the three-dimensional structure, a simple model composed of linear wirings extending in an X direction, a Y direction, and a Z direction, illustrated in three views of FIG. 6, is considered. The three-dimensional structure includes a plurality of wirings Cx extending in the X direction, a plurality of wirings Cy extending in the Y direction, and Z wirings (contacts) Cz connecting the X-direction wirings with the Y-direction wirings. A description will be given of a processing example in which the sample piece (sample) Q is removed at a predetermined interval in the Y direction which is referred to as a processing direction, sequentially from one surface of the three-dimensional structure, so that each cross section Ft serving as an observation target cross section is revealed.

Although an example in which observation and processing are performed on three surfaces of a three-dimensional structure is presented here, only arbitrary two surfaces of a three-dimensional structure will be processed and observed in some cases.

Figure 7:
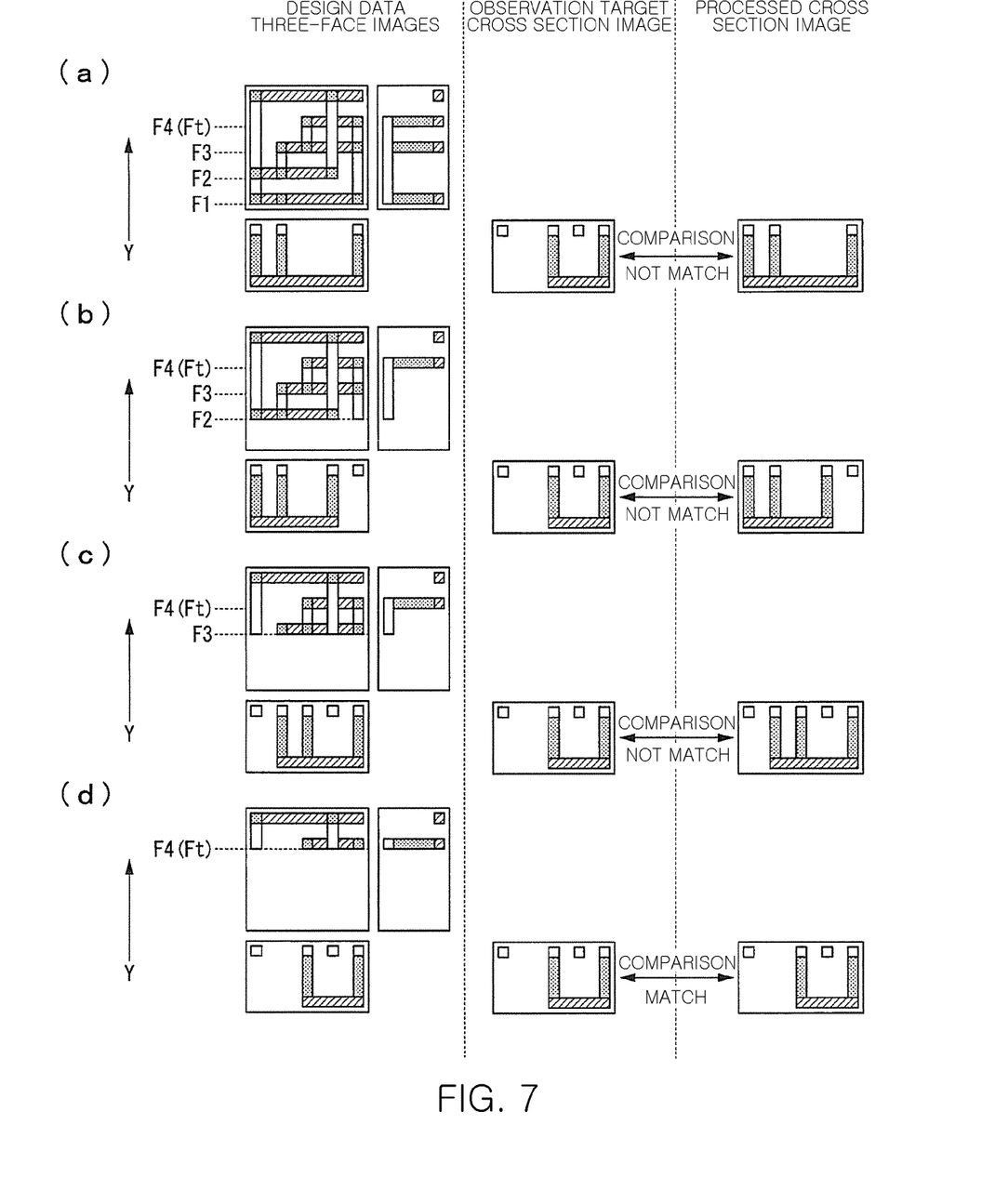
FIG. 7 is an explanatory diagram illustrating a display example of a display device used in the cross section processing observation method of the present invention.

FIG. 7 is a schematic diagram illustrating an example of an image displayed on the display device.

First, a focused ion beam FIB is scanned over the XZ surface of the sample piece (sample) Q in the Z direction, thereby removing a predetermined thickness of the sample piece Q in the Y direction (cross section processing direction)(S11: sample piece forming step). Then, an electron beam EB is emitted to an exposed processed cross section of an F1 position from the electron beam optical system 15 (a new cross section forming step of forming a new cross section by performing a slicing process), and then an image of the formed new cross section of the F1 position on the sample piece Q is obtained (S12: processed cross section acquisition step).

Then, the following images are displayed in parallel on the display device 20: design data three-face images corresponding to the F1 position on the three-dimensional structure, which are based on the design data of the three-dimensional structure; an observation target cross section image which is an image of an observation target cross section based on design data; and an actual processed cross section image which is an actual image of the processed cross section corresponding to the F1 position (see FIG. 7A). Then, the comparator 21b of the computer 21 compares the actual processed cross section image of the position F1 with the observation target cross section image based on the design data (S13: comparison step).

Thus, when the actual processed cross section image differs from the observation target cross section image based on the design data, a focused ion beam FIB is scanned over the XZ face of the sample piece (sample) Q in the Z direction, thereby removing a portion of the sample piece Q (S11: sample piece forming step).

In the state of FIG. 7A, the actual processed cross section image and the corresponding observation target cross section image based on the design data, at the F1 position in the Y direction, differ from each other. Therefore, it is determined that the cross section processing of the sample piece Q has not yet progressed to reach the observation target cross section. In this case, a focused ion beam FIB is emitted again to remove a predetermined amount of the sample piece Q (S11).

Next, a focused ion beam FIB is scanned over the XZ surface of the sample piece (sample) Q along the Z direction, so that a predetermined thickness of the sample piece Q in the Y direction (cross section processing direction) is removed (S11: sample piece forming step). Next, an electron beam EB is emitted to an exposed cross section corresponding to an F2 position from the electron beam optical system 15, thereby obtaining a processed cross section image of the position F2 of the sample piece Q (S12: processed cross section image acquisition step).

Then, as illustrated in FIG. 7B, the comparator 21b of the computer 21 compares the actual processed cross section image of the position F2 with the corresponding observation target cross section image based on the design data (S13: comparison step). In addition, the design data three-face images of the three-dimensional structure are updated in accordance with the progress of processing.

Through the updating process, the data is deleted from a piece corresponding to the display of a portion processed and removed by the focused ion beam FIB. The image data updating is performed by deleting the data, piece by piece, at a predetermined slicing interval. Through the image data updating, it is possible to accurately check actual processing status by using SEM images (observation images). Therefore, it is possible to accurately detect a processing end point, without a risk of over-processing.

For example, in FIG. 7B, that is, at the F2 position in the Y direction, the actual processed cross section image differs from the corresponding observation target cross section image which is based on the design data. Therefore, in this state, it is determined that the cross section processing of the sample piece Q has not yet progressed to reach the observation target cross section, and thus a focused ion beam FIB is emitted again to remove a predetermined amount of the sample piece Q (S11: sample piece forming step).

Next, a focused ion beam FIB is scanned over the XZ surface of the sample piece (sample) Q along the Z direction, so that a portion of the sample piece Q is removed in the Y direction (cross section processing direction) (S11: sample piece forming step). Next, an electron beam EB is emitted to an exposed processed cross section of an F3 position from the electron beam optical system 15, thereby obtaining a processed cross section image of the F3 position of the sample piece Q (S12: processed cross section image acquisition step).

Next, as illustrated in FIG. 7C, the comparator 21b of the computer 21 compares the actual processed cross section image of the position F3 with the corresponding observation target cross section image which is based on the design data (S13: comparison step). Next, the design data three-face images of the three-dimensional structure are updated in accordance with the progress of the processing.

As illustrated in FIG. 7C, at the F3 position in the Y direction, the actual processed cross section image differs from the corresponding observation target cross section image which is based on the design data. Therefore, in this state, it is determined that the cross section processing of the sample piece Q has not yet progressed to reach the observation target cross section. Therefore, a focused ion beam FIB is emitted again to remove a predetermined amount of the sample piece Q (S11: sample piece forming step).

Next, a focused ion beam FIB is scanned over the XZ surface of the sample piece (sample) Q along the Z direction, so that a portion of the sample piece Q is removed in the Y direction (cross section processing direction) (S11: sample piece forming step). Next, an electron beam EB is emitted to an exposed processed cross section of an F4 position from the electron beam optical system 15, thereby obtaining a processed cross section image of the F4 position of the sample piece Q (S12: processed cross section image acquisition step).

Next, as illustrated in FIG. 7D, the comparator 21b of the computer 21 compares the actual processed cross section image of the F4 position with the corresponding observation target cross section image which is based on the design data (S13: comparison step). Next, the design data three-face images of the three-dimensional structure are updated in accordance with the progress of the processing.

In the state of FIG. 7D, the actual processed cross section image of the F4 position in the Y direction matches the observed target cross section image which is based on the design data. Therefore, on the basis of the comparison result output from the comparator 21b, the computer 21 determines that the actual processed cross section image of the position F4 in the Y direction matches the observation target cross section (cross section) Ft, and sets this position as the processing end point (S14: processing end point determination step).

As described above, in a manner of repeating removal of a predetermined amount of the sample piece Q by emitting a focused ion beam FIB to the sample piece and comparison of the actual processed cross section image and the corresponding observation target cross section image based on the image data at a predetermined interval, it is possible to automatically remove a portion of the sample piece (sample) Q until reaching the observation target cross section of the sample piece (sample) Q in an easy and accurate manner without performing the pre-process of forming a processing mark, thereby easily obtaining the sample piece Q with the observation target cross section revealed.

In the comparison step S13 described above, in addition to the comparison between the actual processed cross section image and the corresponding observation target cross section image based on the design data, the coordinates thereof may also be compared. For example, in the comparison step S13, the coordinates of a current processed cross section, included in the design data, are compared with the actual coordinates of the current processed cross section of the sample piece (sample) Q, and it is determined whether the values of the actual coordinates are equal to or less than the values of the coordinates of the observation target cross section in the design data.

In the preliminary process, when the sizes of the images of the three planes of the design data are made to coincide with the sizes of the SEM images of the sample S, it is possible to accurately determine whether the images of the design data match or do not match the SEM images by the same scale.

In this case, it is possible to improve the processing accuracy compared to the case of comparing only the cross section images. For example, when the actual coordinate values are close to the coordinates of the design data corresponding to the observation target cross section, the processing may be controlled to reduce the amount of removal of the sample piece Q processed by a focused ion beam FIB. Thus, it is possible to more precisely process the sample piece to reveal an accurate observation cross section, without excessively deeply scraping the sample piece (sample) Q than the observation target cross section.

In the embodiment described above, an example of forming a sample piece for TEM observation as a sample (sample piece) is presented. In addition to this, the invention can also be used to form a three-dimensional atom probe which is a needle-shaped sample.

That is, when forming a three-dimensional atom probe, a sample piece including an observation target of a three-dimensional structure is extracted in a preliminary step (sampling) of the present invention. Then, in a post process (cross-section processing), the sample piece is irradiated with a focused ion beam FIB so that the sample piece 3 can be processed to become a needle-shaped sample (atom probe sample) including the observation target of the three-dimensional structure.

In the case of such a three-dimensional atom probe, for example, when a positive voltage of 10 kV is applied to a sharp needle-shaped sample with a tip diameter of about 100 nm diameter, a high electric field is formed around the probe tip. Thus, the atomic arrangement of electric field evaporation ions generated due to an electric field evaporation phenomenon can be specified by a two-dimensional detector. Also, ion species can be identified based on the time which is taken for the ions to reach the detector. In this way, it is possible to obtain information on elements contained in the sample and information on a three-dimensional structure of a sample at an atomic level by continuously detecting the individual ions in the depth direction and arranging the ions in order in which the ions are detected.

In addition, in the comparison step S13, an operator can visually compare the actual processed cross section image with the corresponding observation target cross section image which is based on the design data, without using an image comparison software or the like.

Further, in the above-described embodiment, as the preliminary process, an example in which the sample piece Q is micro-sampled from the sample S and the obtained sample piece Q is processed through the cross section image comparison is presented. However, the method may not be divided into a preliminary process and a post process, but a configuration is also possible in which an observation target cross section is revealed by repeatedly performing the partial removal of the sample by the focused ion beam FIB and the comparison of the sectional images of the bulk sample S.

Although the embodiments of the present invention have been described above, these embodiments are presented only for illustrative purposes and are not intended to limit the scope of the invention. These embodiments can be implemented in various other forms, and various omissions, substitutions, and changes can be made without departing from the gist of the invention. These embodiments and modifications thereof fall within the scope and gist of the invention as well as within the scope of the inventions defined in the claims and their equivalents.

What is claimed is:

1. A cross section processing observation method comprising:
   a design data acquisition step of acquiring design data of a three-dimensional structure of a sample having the three-dimensional structure;
   a moving step of moving the sample based on coordinate information of the design data;
   a surface observation step of acquiring an observation image of a surface of the sample;
   a cross section forming step of irradiating the surface of the sample with an ion beam to form a cross section of the three-dimensional structure;
   a cross section observation step of acquiring an observation image of the cross section; and
   a display step of displaying, among pieces of the design data, image data of a surface and a cross section corresponding to locations of the surface and the cross section, respectively.

2. The cross section processing observation method according to claim 1, further comprising:
   a new cross section forming step of forming a new cross section by performing a slicing process on the cross section at a predetermined slicing thickness; and
   an updating step of updating, among the pieces of the design data, image data of a cross section corresponding to a location of the new cross section.

3. The cross section processing observation method according to claim 1, further comprising:
   a positioning step of determining a location of sampling for the sample based on the design data; and
   a comparison step in the cross section forming step of comparing an observation image of the cross section of the sample with the image data, among the pieces of the design data, of a cross section at a location corresponding to the observation image of the cross section.

4. The cross section processing observation method according to claim 2, further comprising:
   a location-determining step of determining a location of sampling for the sample based on the design data; and
   a comparison step in the cross section forming step of comparing an observation image of the cross section of the sample with the image data, among the pieces of the design data, of a cross section at a location corresponding to the observation image of the cross section.

5. A charged particle beam apparatus comprising:
   a charged particle beam column configured to irradiate a sample having a three-dimensional structure with a charged particle beam;
   a storage unit configured to store design data of the three-dimensional structure;
   a secondary particle detector configured to detect secondary particles released from a surface and a cross section of the sample by irradiation with the charged particle beam;
   an image forming unit configured to form, based on a detection signal output from the secondary particle detector, an observation image of the surface of the sample and an observation image of the cross section of the sample; and
   a display control device configured to display, among pieces of the design data, image data of a surface and a cross section corresponding to respective locations of the surface and the cross section of the sample.

6. The charged particle beam apparatus according to claim 5, further comprising an updating unit configured to update, among the pieces of the design data, image data of a cross section corresponding to a location of a newly exposed cross section resulting from the slicing process, in association with a slicing process of the sample by irradiation with the charged particle beam.

7. The charged particle beam apparatus according to claim 5, further comprising a comparator configured to compare an observation image of the sample with the image data, among the pieces of the design data, of a cross section corresponding to the location of the cross section.

8. The charged particle beam apparatus according to claim 6, further comprising a comparator configured to compare an observation image of the sample with the image data, among the pieces of the design data, of a cross section corresponding to the location of the cross section.

9. The cross section processing observation method according to claim 1, wherein the image data of a surface and a cross section corresponding to locations of the surface and the cross section is displayed together with the acquired observation image of the cross section in the display step.

10. The charged particle beam apparatus according to claim 5, wherein the display control device is configured to display the image data of a surface and a cross section corresponding to respective locations of the surface and the cross section of the sample together with the observation image of the cross section of the sample formed by the image forming unit.

* * * * *